(12) United States Patent
Yang et al.

(10) Patent No.: US 10,574,271 B2
(45) Date of Patent: Feb. 25, 2020

(54) DATA STORAGE SYSTEM AND ASSOCIATED METHOD FOR SAVING STORAGE SPACE AND ELIMINATING DATA ERRORS

(71) Applicant: Silicon Motion Inc., Hsinchu County (TW)

(72) Inventors: Tsung-Chieh Yang, Hsinchu (TW); Sheng-I Hsu, Hsinchu County (TW)

(73) Assignee: Silicon Motion, Inc., Hinschu County (TW)

( * ) Notice: Subject to any disclaimer, the term of this patent is extended or adjusted under 35 U.S.C. 154(b) by 0 days.

(21) Appl. No.: 16/053,815

(22) Filed: Aug. 3, 2018

(65) Prior Publication Data

US 2018/0341545 A1 Nov. 29, 2018

Related U.S. Application Data

(62) Division of application No. 15/260,330, filed on Sep. 9, 2016.

(30) Foreign Application Priority Data

Sep. 11, 2015 (TW) .............................. 104130059 A

(51) Int. Cl.
*G06F 11/10* (2006.01)
*G06F 12/02* (2006.01)
*H03M 13/29* (2006.01)
*H03M 13/13* (2006.01)
*H03M 13/09* (2006.01)

(52) U.S. Cl.
CPC ....... *H03M 13/2906* (2013.01); *H03M 13/09* (2013.01); *H03M 13/13* (2013.01); *G06F 2212/1032* (2013.01); *G06F 2212/214* (2013.01); *G06F 2212/403* (2013.01); *G06F 2212/7201* (2013.01)

(58) Field of Classification Search
None
See application file for complete search history.

(56) References Cited

U.S. PATENT DOCUMENTS

| 9,053,012 | B1 * | 6/2015 | Northcott | ............ G06F 12/0246 |
| 9,208,018 | B1 * | 12/2015 | Northcott | ............ G06F 11/1008 |
| 9,292,379 | B2 | 3/2016 | Grimsrud | |
| 9,619,381 | B2 | 4/2017 | Camp | |
| 2015/0039970 | A1 | 2/2015 | Sharon | |

(Continued)

FOREIGN PATENT DOCUMENTS

| CN | 103064640 A | 4/2013 |
| CN | 104731523 A | 6/2015 |

(Continued)

*Primary Examiner* — Justin R Knapp
(74) *Attorney, Agent, or Firm* — Winston Hsu

(57) ABSTRACT

A data storage system includes a processing circuit, a lookup table (LUT), and a decoding circuit. The processing circuit is arranged to receive a first logical block address (LBA) from a host. The LUT is arranged to store a storage address mapping to the first LBA. The decoding circuit is arranged to utilize the storage address to read storage data from a storing circuit, and decode a first data sector in the storage data according to an error checking and correcting code in the storage data, and the first data sector at least comprises a second LBA.

2 Claims, 6 Drawing Sheets

(56) References Cited

U.S. PATENT DOCUMENTS

| | | |
|---|---|---|
| 2015/0095737 A1 | 4/2015 | Grimsrud |
| 2015/0161036 A1 | 6/2015 | Camp |
| 2016/0239207 A1* | 8/2016 | Takakura .............. G06F 3/0604 |
| 2017/0003880 A1 | 1/2017 | Fisher |
| 2017/0024275 A1 | 1/2017 | Grimsrud |
| 2017/0279918 A1 | 9/2017 | Honmura |

FOREIGN PATENT DOCUMENTS

| | | |
|---|---|---|
| TW | 200847165 | 12/2008 |
| TW | 201314449 A1 | 4/2013 |

* cited by examiner

DATA STORAGE SYSTEM AND ASSOCIATED METHOD FOR SAVING STORAGE SPACE AND ELIMINATING DATA ERRORS

CROSS REFERENCE TO RELATED APPLICATIONS

This divisional application claims the benefit of U.S. Non-Provisional application Ser. No. 15/260,330 filed on 2016 Sep. 9. The entire content of the related application is included herein by reference.

BACKGROUND OF THE INVENTION

1. Field of the Invention

The present invention relates to a data storage system and an associated method, and more particularly, to a data format capable of reducing the amount of stored data, and an associated method.

2. Description of the Prior Art

Development of technology requiring more and more data to be written into or read from a flash memory means that the capacity of flash memories needs to be increased. When a host is going to store a data byte into a flash memory, a control circuit of the flash memory will store the data byte with a fixed format, generally comprising at least four portions. A first portion is the data byte, the second portion is a logical block address (LBA) from the host, the third portion is a cyclic redundancy check (CRC) code, and the fourth portion is an error checking and correcting code, wherein the LBA, the CRC code and the error checking and correcting code are not data from the host, but are still written into flash memories. When a large amount of data is to be stored into a flash memory, all these non-data portions may occupy a lot of storage space of the flash memory. Hence, how to effectively store a data byte into a flash memory or read the data byte from the flash memory is an issue to be solved in this field.

SUMMARY OF THE INVENTION

An objective of the present invention is to provide a data format that can reduce data storage, and an associated method.

A first embodiment of the present invention provides a data storage system which comprises a processing circuit, a lookup table (LUT), and a decoding circuit. The processing circuit is arranged to receive a first LBA from a host. The LUT is arranged to store a storage address mapping to the first LBA. The decoding circuit is arranged to utilize the storage address to read storage data from a storing circuit, and decode a first data sector in the storage data according to an error checking and correcting code in the storage data, and the first data sector at least comprises a second LBA.

A second embodiment of the present invention provides a data storing method. The method comprises: receiving a first logical block address (LBA) from a host; utilizing a (lookup table) LUT to store a storage address that maps to the first LBA; utilizing the storage address to read storage data from a storing circuit; and decoding a first data sector in the storage data according to an error checking and correcting code in the storage data, wherein the first data sector at least comprises a second LBA.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
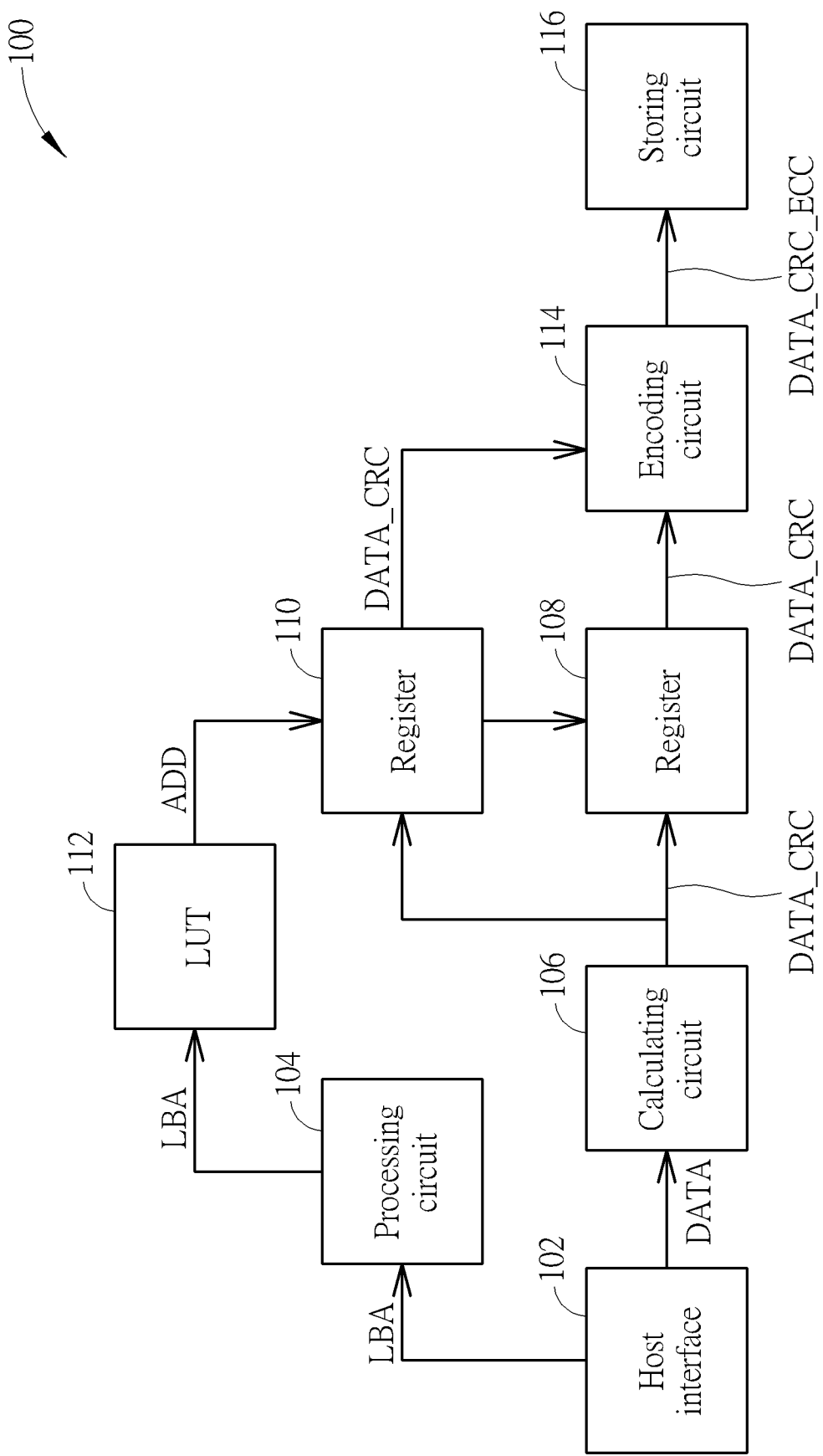
FIG. 1 is a diagram illustrating a data storage system according to a first embodiment of the present invention.

FIG. 1 is a diagram illustrating a data storage system 100 according to a first embodiment of the present invention. The data storage system 100 comprises a host interface 102, a processing circuit 104, a calculating circuit 106, a plurality of registers 108 and 110, a lookup table (LUT) 112, an encoding circuit 114, and a storing circuit 116. The data storage system 100 may be a flash memory storage system or any other type of storage system. The data storage system 100 is connected to a host (not shown in the figure), and the host may be arranged to access the data storage system 100. For better understanding, the data storage system 100 may be viewed as a data writing system. Therefore, the host interface 102 is arranged to receive signals from the host or transmit signals to the host. The processing circuit 104 may be a central processing circuit (CPU) or a controlling circuit. The processing circuit 104 is arranged to receive a data byte DATA and a corresponding logical block address LBA from the host. The calculating circuit 106 may be an end-to-end path protection circuit. The calculating circuit 106 is arranged to generate a cyclic redundancy check code CRC according to the logical block address LBA, and combine the cyclic redundancy check code CRC and the data byte DATA into a data sector DATA_CRC. The encoding circuit 114, which is connected to the storing circuit 116, is arranged to encode the data sector DATA_CRC generated by the calculating circuit 106 to generate an error checking and correction code ECC, and combine the data sector DATA_CRC and the error checking and correction code ECC into the storage data DATA_CRC_ECC. The storing circuit 116, which may be a flash memory, is arranged to store the storage data DATA_CRC_ECC generated by the encoding circuit 114.

Since it may take a long time for the encoding circuit 114 to encode the data sector DATA_CRC, and the data sector DATA_CRC from the calculating circuit 106 may not be immediately encoded by the encoding circuit 114, the data sector DATA_CRC may be temporarily stored in the different registers of the data storage system 100, i.e. the registers 108, 110 illustrated in FIG. 1. The registers 108, 110 may be dynamic random access memories (DRAMs) coupled between the calculating circuit 106 and the encoding circuit 114. The present invention is not limited to the number of registers. The two registers 108 and 110 shown in FIG. 1 are merely for illustrative purposes. The data sector DATA_CRC may be temporarily stored in the registers 108 or 110, and then be sent to the encoding circuit 114. Further, the data sector DATA_CRC may be directly sent to the encoding circuit 114 from the calculating circuit 106.

When the data sector DATA_CRC is written into the registers 108 or read from the registers 108 or 110, to ensure the correctness of the data byte DATA in the data sector DATA_CRC, the calculating circuit 106 (or the processing circuit 104) will check the correctness of the data sector DATA_CRC according to the cyclic redundancy check code CRC in the data sector DATA_CRC. Via the cyclic redundancy check code CRC, the data storage system 100 may ensure that the data written into the registers 108 or 110 is consistent with that read from the registers 108 or 110. For example, the calculating circuit 106 may determine whether the cyclic redundancy check code CRC in the data sector DATA_CRC written into the register 108 is equal to the cyclic redundancy check code CRC in the data sector DATA_CRC read from the register 108. If yes, this means that the data byte DATA in the data sector DATA_CRC read from the register 108 is not distorted; otherwise, an error has occurred in the data byte DATA in the data sector DATA_CRC read from the register 108, so the data storage system 100 will have to re-read the data or debug errors.

The LUT 112 shown in FIG. 1 is arranged to store a storage address ADD which maps to the logical block address LBA, wherein the storage address ADD is a physical address of the storing circuit 116, and the storage address ADD is arranged to store the storage data DATA_CRC_ECC. When the data storage system 100 receives a data byte DATA and a corresponding logical block address LBA from the host, the processing circuit 104 will find the storage address ADD corresponding to the logical block address LBA through checking the LUT 112, and write the encoded data byte (i.e. DATA_CRC_ECC) into the storage address ADD of the storing circuit 116. Note that the LUT 112 of the present invention may exist in an independent memory, a memory of the processing circuit 104, or a memory of other components.

According to the embodiment of the present invention, when the calculating circuit 106 combines the cyclic redundancy check code CRC and the data byte DATA into a data sector DATA_CRC, the calculating circuit 106 does not combine the logical block address LBA into the data sector DATA_CRC. Compared with the related art methods, this embodiment may reduce the number of bit of the data sector DATA_CRC, so that the storage space occupied by the encoded storage data DATA_CRC_ECC will be smaller and the data capacity of the storing circuit 116 is raised. For example, if the size of each data byte DATA is 512 bytes, the size of each logical block address LBA is 4 bytes, and the size of each cyclic redundancy check code CRC is 2 bytes, 4 bytes are saved for each storage data DATA_CRC_ECC in the storing circuit 116. Note that, although the calculating circuit 106 in this embodiment does not combine the logical block address LBA into the data sector DATA_CRC, since the cyclic redundancy check code CRC is generated according to the logical block address LBA, the cyclic redundancy check code CRC in this embodiment substantially includes the information of the logical block address LBA. In this way, when the cyclic redundancy check code CRC and the data byte DATA are combined into a data sector DATA_CRC, the data sector DATA_CRC will include the information of the logical block address LBA. Compared with the related art methods, this embodiment does not directly store the logical block address LBA, but rather encodes/integrates/combines the data storing the logical block address LBA into the cyclic redundancy check code CRC instead. Hence, this embodiment may reduce the space occupied by storing the logical block address LBA.

Figure 2:
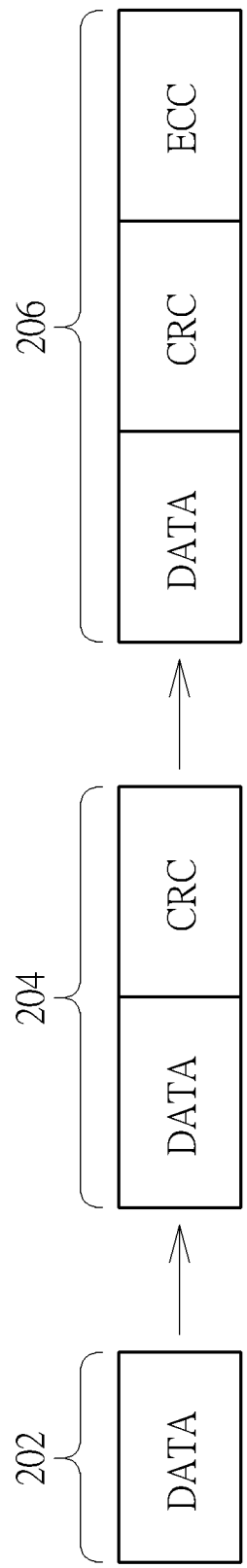
FIG. 2 is a diagram illustrating respective formats of a data byte, a data sector and a storage data according to a first embodiment of the present invention.

FIG. 2 is a diagram illustrating respective formats of a data byte DATA, a data sector DATA_CRC and a storage data DATA_CRC_ECC according to a first embodiment of the present invention. The block 202 represents the data byte DATA received by the host interface 102. The block 204 represents the data sector DATA_CRC outputted from the calculating circuit 106, wherein the data sector DATA_CRC comprises the data byte DATA and the cyclic redundancy check code CRC, but does not include the logic block address LBA. The block 206 represents the storage data DATA_CRC_ECC outputted by the encoding circuit 114, wherein the storage data DATA_CRC_ECC comprises the data byte DATA, the cyclic redundancy check code CRC and the error checking and correction code ECC. Note that when the host interface 102 receives a data byte DATA and a corresponding logic block address LBA, the processing circuit 104 may write the logic block address LBA into the LUT 112 at the same time, and map the logic block address LBA to a storage address ADD. Next, the encoding circuit 114 may write the outputted storage data DATA_CRC_ECC into the storage address ADD of the storing circuit 116.

Figure 3:
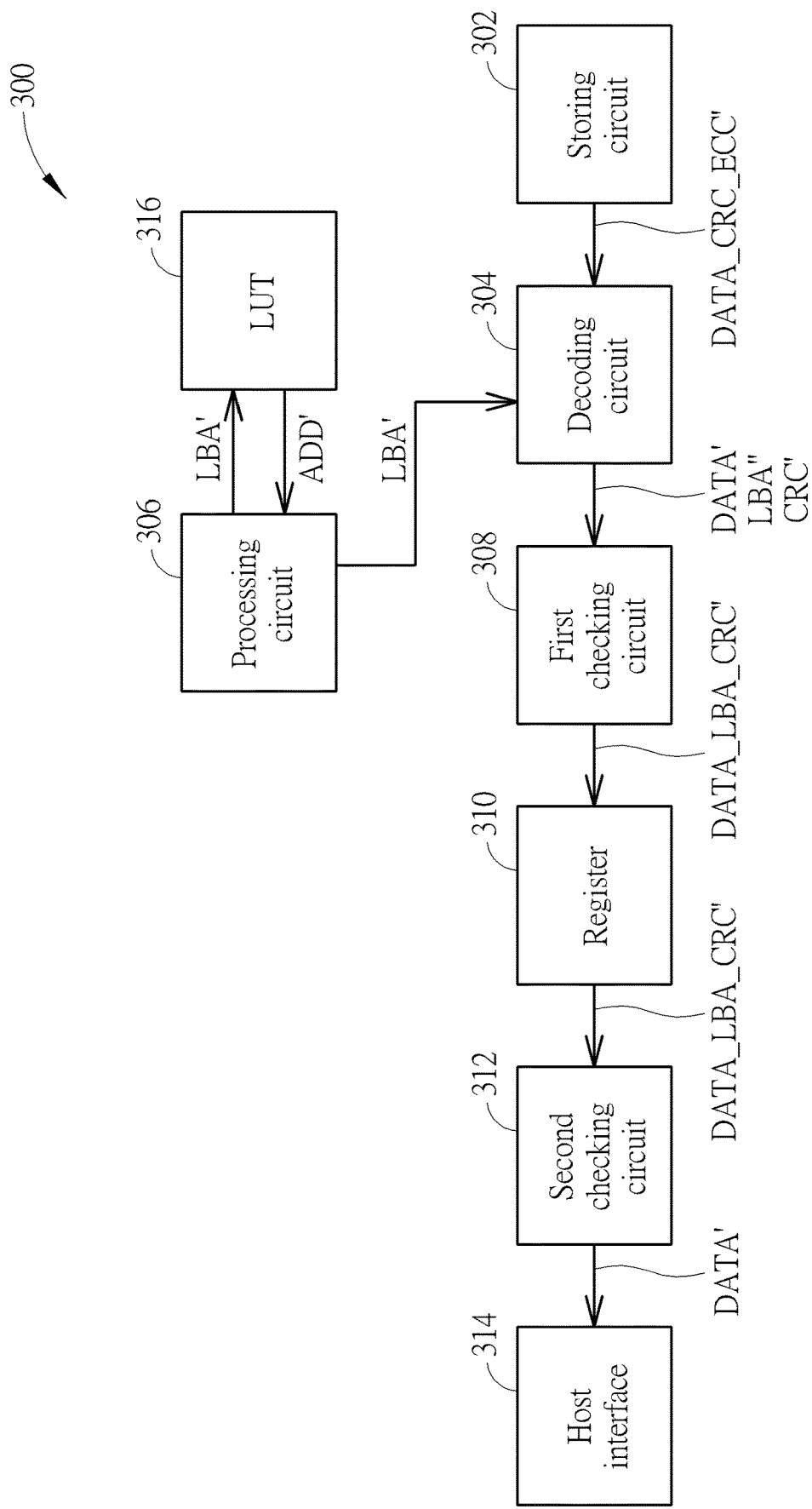
FIG. 3 is a diagram illustrating a data storage system according to a second embodiment of the present invention.

FIG. 3 is a diagram illustrating a data storage system 300 according to a second embodiment of the present invention. The data storage system 300 comprises a storing circuit 302, a decoding circuit 304, a processing circuit 306, a first checking circuit 308, a register 310, a second checking circuit 312, a host interface 314 and a LUT 316. Compared with the embodiment shown in FIG. 1, the data storage system 300 in this embodiment may be viewed as a data reading system. More specifically, the data storage system 300 is arranged to read the data written by the data storage system 100. When the processing circuit 306 receives a controlling signal from a host (not shown) through the host interface 314 to read storage data DATA_CRC_ECC' of a logical block address LBA' from the storing circuit 302, the processing circuit 306 may find a storage address ADD' mapping to the logical block address LBA' in the LUT 316 in advance. Next, the decoding circuit 304 may read the storage data DATA_CRC_ECC' from the storing circuit 302 according to the storage address ADD'. According to the operations of the data storage system 100 mentioned above, the format of the storage data DATA_CRC_ECC' may comprise three portions, wherein the first portion is a data byte DATA', the second portion is a cyclic redundancy check code CRC', and the third portion is an error checking and correcting code ECC'. Note that the format of the storage data DATA_CRC_ECC' read by the decoding circuit 304 does not include a logical block address. This is because the logical block address has been integrated into the cyclic redundancy check code CRC' as illustrated in FIG. 4.

Figure 4:
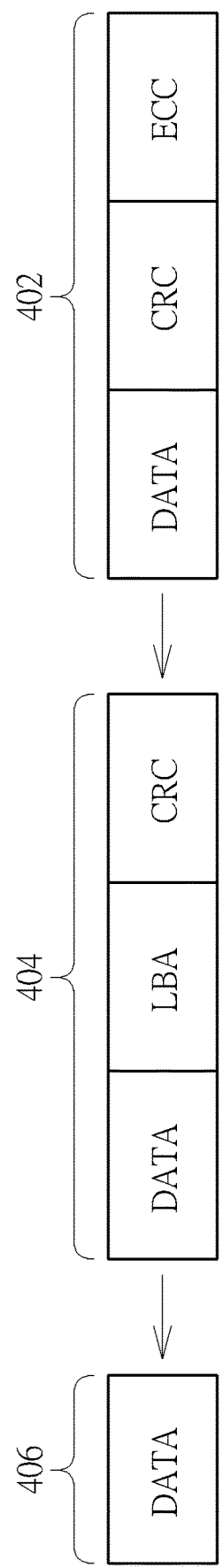
FIG. 4 is a diagram illustrating respective formats of a data byte, a data sector and a storage data according to a second embodiment of the present invention.

FIG. 4 is a diagram illustrating respective formats of a data byte DATA', a data sector DATA_CRC' and a storage data DATA_CRC_ECC' according to a second embodiment of the present invention. The block 402 represents the storage data DATA_CRC_ECC' read by the decoding circuit 304, wherein the storage data DATA_CRC_ECC' comprises a data byte DATA', a cyclic redundancy check code CRC' and an error checking and correcting code ECC'. The block 404 represents the data sector DATA_LBA_CRC' outputted by the first checking circuit 308, wherein the data sector DATA_LBA_CRC' comprises a data byte DATA, a logical block address LBA' and a cyclic redundancy check code CRC'. The block 406 represents the data byte DATA' outputted by the second checking circuit 312.

After the storage data DATA_CRC_ECC' is read by the decoding circuit 304, the decoding circuit 304 may use the error checking and correcting code ECC' to check the correctness of the read storage data DATA_CRC_ECC'. If the error checking and correcting code ECC' can be used to decode the data byte DATA' and the cyclic redundancy check code CRC', this means that the read storage data DATA_CRC_ECC' is correct data. If the error checking and correcting code ECC' cannot be used to decode the data byte DATA' and the cyclic redundancy check code CRC', this means that there are errors in the read storage data DATA_CRC_ECC'. If there are errors in the storage data DATA_CRC_ECC', the data storage system 300 will reread or debug the storage data.

Note that, if the storage data DATA_CRC_ECC' is correct, the decoding circuit 304 will decode and output a logical block address LBA" according to the cyclic redundancy check code CRC'. Furthermore, the decoding circuit 304 may remove the error checking and correcting code ECC'. After the error checking and correcting code ECC' is removed, the data comprising the logical block address LBA", data byte DATA' and cyclic redundancy check code CRC' is transmitted to the first checking circuit 308.

When the first checking circuit 308 receives the logical block address LBA", data byte DATA' and the cyclic redundancy check code CRC' from the decoding circuit 304, the first checking circuit 308 may determine whether the logical block address LBA" received from the encoding circuit 304 is equal to the logical block address LBA' received from the processing circuit 306. If the logical block address LBA" received from the encoding circuit 304 is equal to the logical block address LBA' received from the processing circuit 306, this means that the data read from the storing circuit 302 by the decoding circuit 304 is the data needed by the host. The first checking circuit 308 may thereby determine the logical block address LBA", the data byte DATA' and the cyclic redundancy check code CRC' from the decoding circuit 304 as correct. Furthermore, when the first checking circuit 308 receives the logical block address LBA", data byte DATA' and the cyclic redundancy check code CRC' from the decoding circuit 304, the first checking circuit 308 may also check whether the cyclic redundancy check code CRC' is correct, in order to determine whether the received data is distorted. When the logical block address LBA" and the cyclic redundancy check code CRC' from the decoding circuit 304 are determined to be correct, the first checking circuit 308 may combine the data byte DATA', the logical block address LBA' (i.e. LBA") and the cyclic redundancy check code CRC' into the data sector DATA_LBA_CRC' as illustrated in FIG. 4, and output the data sector DATA_LBA_CRC' to the register 310.

When the second checking circuit 312 receives the data sector DATA_LBA_CRC' from the register 310, the second checking circuit 312 may determine whether an error occurs in the data outputted by the register 310 according to the cyclic redundancy check code CRC' in the data sector DATA_LBA_CRC'. When the second checking circuit 312 determines that the data outputted by the register 310 is correct, the second checking circuit 312 may remove the cyclic redundancy check code CRC' and the logical block address LBA' in the data sector DATA_LBA_CRC', and output the data byte DATA' (i.e. the data byte shown in the block 406 of FIG. 4) to the host interface 314.

As can be seen from the operation of the data storage system 300 above, the first checking circuit 308 checks whether each logical block address LBA" in the storage data DATA_CRC_ECC' read by the storing circuit 302 is equal to the logical block address LBA' received by the processing circuit 306, which reduces the silent error rate. The second checking circuit 312 may also check whether the data outputted by the register 310 is correct according to the cyclic redundancy check code CRC' in the data sector DATA_LBA_CRC', which reduces the probability of 1-bit errors. Therefore, the storage data formats provided by the present invention may effectively save storage space of the storing circuit, and reduce errors which occur when storing, reading and transmitting data.

Note that, although the data writing operation and data reading operation are described in the data storage system 100 of FIG. 1 and the data storage system 300 of FIG. 3, respectively, the present invention is not limited thereto. In practice, the data storage system 100 and the data storage system 300 may be integrated as one data accessing system. For example, when the data storage system 100 and the data storage system 300 are integrated as one data accessing system, the host interface 102 and the host interface 314 may be jointly viewed as one host interface, the processing circuit 104 and the processing circuit 306 may be jointly viewed as one processing circuit, the register 108 and the register 310 may be viewed as one register, the storing circuit 116 and the storing circuit 302 may be jointly viewed as one storing circuit, and the LUT 112 and the LUT 316 may be jointly viewed as one LUT. Since one skilled in the art can easily understand operations of such a data storage system after reading operations of the data storage system 100 and the data storage system 300 mentioned above, a detailed description is omitted here for brevity.

In the above paragraphs, the data storage system 100 and the data storage system 300 are illustrated as different components, to stress that the functions thereof are different. In some modifications, the data storage system 100 and the data storage system 300 can be integrated as one or more chips. This also belongs to the scope of the present invention.

Figure 5:
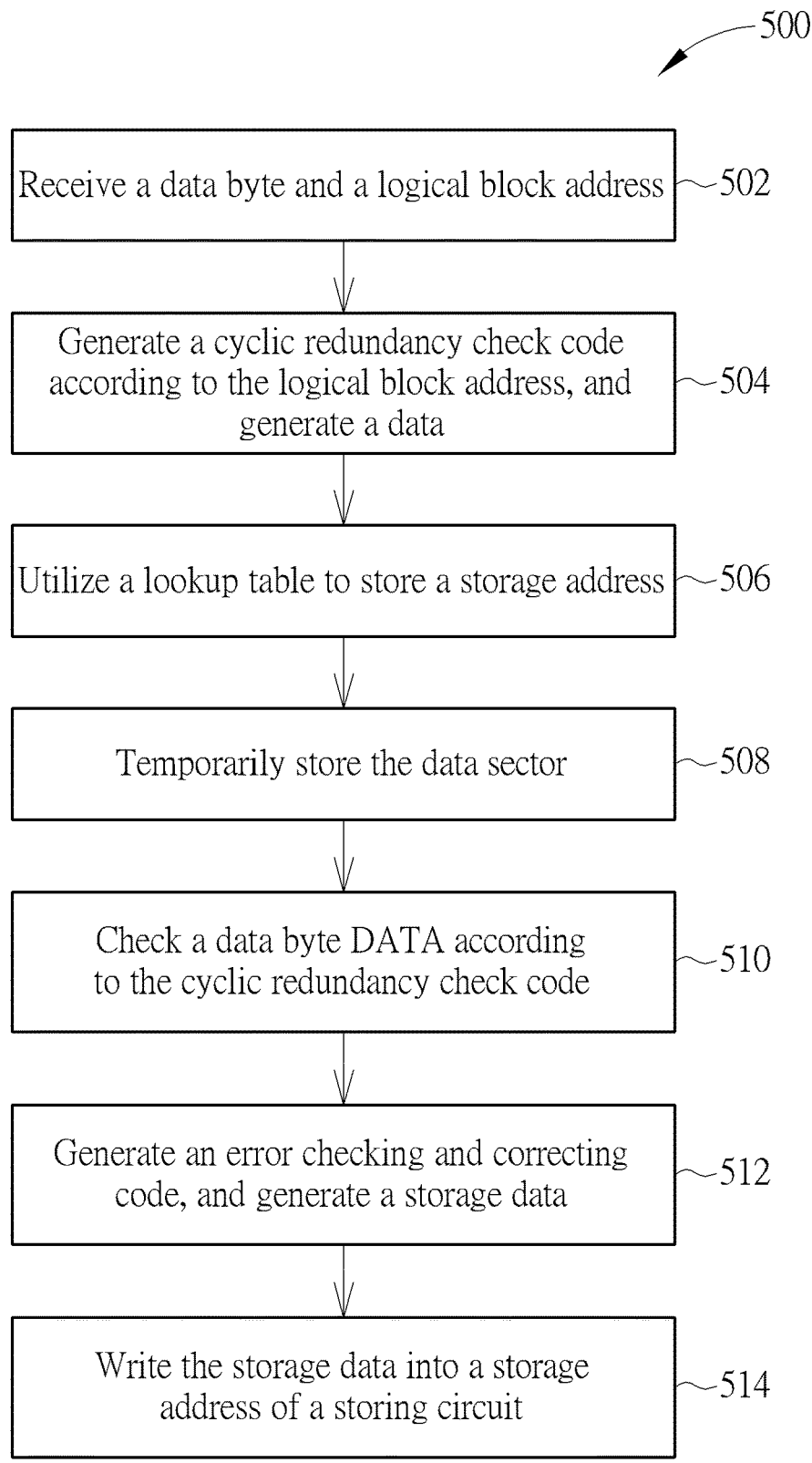
FIG. 5 is a flowchart illustrating a data storing method according to a first embodiment of the present invention.

The operations of the data storage system 100 may be summarized by FIG. 5. FIG. 5 is a flowchart illustrating a data storing method 500 according to a first embodiment of the present invention. If the result is substantially the same, the steps are not required to be executed in the exact order shown in FIG. 5. The method 500 is as follows.

Step 502: Receive a data byte DATA and a logical block address LBA from a host;

Step 504: Generate a cyclic redundancy check code CRC according to the logical block address LBA, and combine the cyclic redundancy check code CRC and the data byte DATA into a data sector DATA_CRC;

Step 506: Utilize the LUT 112 to store a storage address ADD that maps to the logical block address LBA;

Step 508: Utilize at least one register to temporarily store the data sector DATA_CRC;

Step 510: Check the correctness of the data byte DATA according to the cyclic redundancy check code CRC in the data sector DATA_CRC;

Step 512: Encode the data sector DATA_CRC to generate an error checking and correcting code ECC, and combine the data sector DATA_CRC and the error checking and correcting code ECC into a storage data DATA_CRC_ECC; and Step 514: Write the storage data DATA_CRC_ECC into a storage address ADD of the storing circuit 116.

Figure 6:
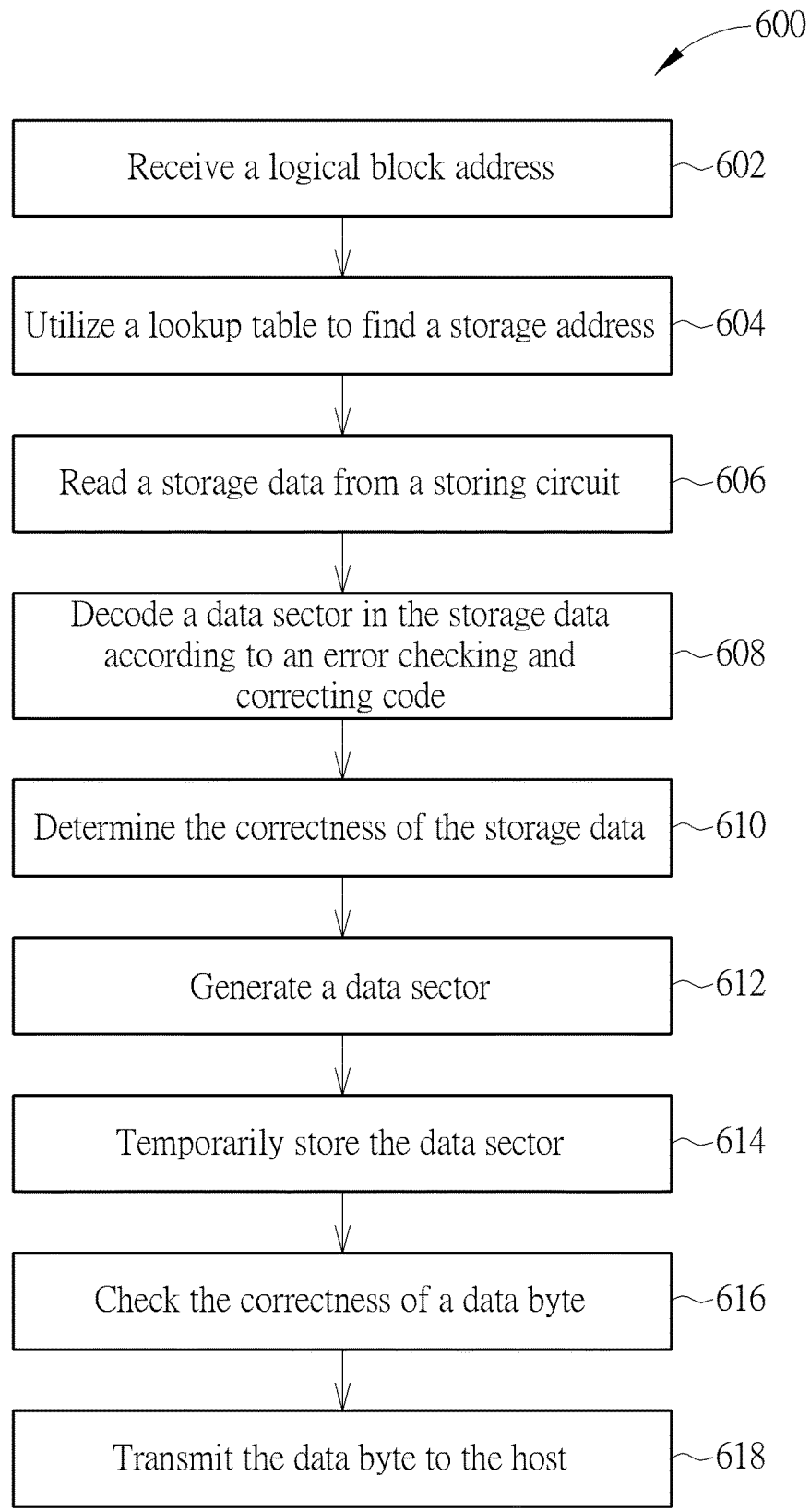
FIG. 6 is a flowchart illustrating a data storing method according to a second embodiment of the present invention.

The operations of the data storage system 100 may be summarized by FIG. 6. FIG. 6 is a flowchart illustrating a data storing method 600 according to a second embodiment of the present invention. If the result is substantially the same, the steps are not required to be executed in the exact order shown in FIG. 6. The method 600 is as follows.

Step 602: Receive a logical block address LBA' from a host;

Step 604: Utilize the LUT 316 to find a storage address ADD' mapping to the logical block address LBA';

Step 606: Utilize the storage address ADD' to read a storage data DATA_CRC_ECC' from the storing circuit 302;

Step 608: Decode a data sector in the storage data DATA_CRC_ECC' according to an error checking and correcting code ECC' in the storage data DATA_CRC_ECC', wherein the data sector comprises at least one logical block address LBA";

Step 610: Determine whether the logical block address LBA' is equal to the logical block address LBA", to determine the correctness of the storage data DATA_CRC_ECC', and determine the correctness of the storage data DATA_CRC_ECC' according to a cyclic redundancy check CRC';

Step 612: Combine the data byte DATA', logical block address LBA' and cyclic redundancy check code CRC' into a data sector DATA_LBA_CRC';

Step 614: Utilize at least one register to temporarily store the data sector DATA_LBA_CRC';

Step 616: Check the correctness of the data byte DATA' according to the cyclic redundancy check code CRC' in the data sector DATA_LBA_CRC'; and Step 618: Remove the logical block address LBA' and the cyclic redundancy check code CRC' in the data sector DATA_LBA_CRC' to output the data byte DATA' to the host interface 314, in order to transmit the data byte DATA' to the host.

In summary, the storage data format provided by the embodiment of the present invention does not store a logical block address from a host into the storing circuit, thus reducing the size of the storage data. Furthermore, the data storage system of the present invention may check whether each logic block address in the storage data read from the storing circuit is equal to the logic lock address received by the processing circuit, which can reduce static errors. The data storage system of the present invention may also refer to the cyclic redundancy check code in the data sector to check whether the data output by the register is correct or not, to reduce the probability of 1-bit errors. Therefore, the storage data formats provided by the present invention may effectively reduce occupied storage space, and may reduce errors which occur when storing, reading and transmitting data.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data storage system, comprising:
a processing circuit arranged to receive a first logical block address (LBA) from a host;
a lookup table (LUT) arranged to store a storage address mapping to the first LBA;
a decoding circuit arranged to utilize the storage address to read storage data from a storing circuit, and decode a first data sector in the storage data according to an error checking and correcting code in the storage data, wherein the first data sector at least comprises a second LBA;
a first checking circuit, arranged to determine whether the first LBA is equal to the second LBA, to determine correctness of the storage data; wherein the first data sector further comprises a cyclic redundancy check code, and the first checking circuit determines correctness of the storage data according to the cyclic redundancy check code; the first data sector further comprises a data byte, and the first checking circuit combines the data byte, the second LBA and the cyclic redundancy check code into a second data sector; and
a second checking circuit, arranged to determine correctness of the data byte according to the cyclic redundancy check code in the second data sector, and remove the second LBA in the second data sector, in order to output the data byte to the host.

2. A data storing method, comprising:
receiving a first logical block address (LBA) from a host;
utilizing a lookup table (LUT) to store a storage address that maps to the first LBA;
utilizing the storage address to read storage data from a storing circuit;
decoding a first data sector in the storage data according to an error checking and correcting code in the storage data, wherein the first data sector at least comprises a second LBA; and
determining whether the first LBA is equal to the second LBA, to determine correctness of the storage data;
wherein the first data sector further comprises a cyclic redundancy check code, and the method comprises: determining correctness of the storage data according to the cyclic redundancy check code; the first data sector further comprises a data byte; and the method further comprises:
combining the data byte, the second LBA and the cyclic redundancy check code into a second data sector;
determining correctness of the data byte according to the cyclic redundancy check code in the second data sector; and
removing the second LBA in the second data sector to output the data byte to the host.

* * * * *

UNITED STATES PATENT AND TRADEMARK OFFICE
CERTIFICATE OF CORRECTION

Page 1 of 1

PATENT NO. : 10,574,271 B2
APPLICATION NO. : 16/053815
DATED : February 25, 2020
INVENTOR(S) : Tsung-Chieh Yang et al.

It is certified that error appears in the above-identified patent and that said Letters Patent is hereby corrected as shown below:

On the Title Page

Item (73), correct the address of the assignee from "Hinschu County (TW)" to --Hsinchu County (TW)--.

Signed and Sealed this
Seventh Day of April, 2020

Andrei Iancu
*Director of the United States Patent and Trademark Office*